United States Patent
Chou et al.

(10) Patent No.: US 6,874,044 B1
(45) Date of Patent: Mar. 29, 2005

(54) FLASH DRIVE/READER WITH SERIAL-PORT CONTROLLER AND FLASH-MEMORY CONTROLLER MASTERING A SECOND RAM-BUFFER BUS PARALLEL TO A CPU BUS

(75) Inventors: Horng-Yee Chou, Palo Alto, CA (US); Sun-Teck See, San Jose, CA (US); Tzu-Yih Chu, San Jose, CA (US)

(73) Assignee: SuperTalent Electronics, Inc., San Jose, CA (US)

( * ) Notice: Subject to any disclaimer, the term of this patent is extended or adjusted under 35 U.S.C. 154(b) by 41 days.

(21) Appl. No.: 10/605,140

(22) Filed: Sep. 10, 2003

(51) Int. Cl.[7] .......................... G06F 13/00; G06F 13/12
(52) U.S. Cl. .......................... 710/62; 710/72; 710/110; 710/52
(58) Field of Search .......................... 710/62, 72, 110, 710/52

(56) References Cited

U.S. PATENT DOCUMENTS

| | | | |
|---|---|---|---|
| 5,359,715 A | 10/1994 | Heil et al. | 710/312 |
| 5,375,089 A | 12/1994 | Lo | 365/189.04 |
| 5,530,828 A | 6/1996 | Kaki et al. | 711/103 |
| 5,586,248 A | 12/1996 | Alexander et al. | 713/22 |
| 5,634,073 A | 5/1997 | Collins et al. | 710/5 |
| 5,694,556 A | 12/1997 | Neal et al. | 710/310 |
| 5,745,732 A | 4/1998 | Cherukuri et al. | 711/168 |
| 5,822,251 A | 10/1998 | Bruce et al. | 365/185.13 |
| 5,872,994 A * | 2/1999 | Akiyama et al. | 712/43 |
| 6,101,566 A | 8/2000 | Woods et al. | 710/315 |
| 6,457,092 B1 | 9/2002 | Kaki et al. | 711/103 |
| 6,467,015 B1 | 10/2002 | Nolan et al. | 711/5 |
| 6,490,639 B1 | 12/2002 | Delvaux et al. | 710/36 |
| 6,507,881 B1 * | 1/2003 | Chen | 70/305 |
| 6,513,094 B1 | 1/2003 | Magro | 711/103 |
| 6,581,124 B1 | 6/2003 | Anand et al. | 710/305 |
| 6,708,257 B2 * | 3/2004 | Bao | 711/154 |
| 2003/0018892 A1 | 1/2003 | Tello | 713/164 |
| 2003/0145141 A1 | 7/2003 | Chen et al. | 710/74 |

OTHER PUBLICATIONS

Certified USB, "Introduction to USB On–The–Go", 9/03, pp 1.

Ours Technology Inc., "OTi–2168" Data Sheet, 9/03, pp 1–8.

Genesys Logic, Inc., "GL814–" specification, Dec. 10, 2002, pp 1–21.

* cited by examiner

Primary Examiner—Kim Huynh
(74) Attorney, Agent, or Firm—Stuart T. Auvinen

(57) ABSTRACT

A flash-drive or flash-card reader connects to a personal computer (PC) through a serial link such as a Universal-Serial-Bus (USB), IEEE 1394, SATA, or IDE. A local CPU acts as the bus master of a CPU bus that connects to slave ports on a flash-memory controller, a serial engine, and a RAM buffer. A second bus in parallel to the CPU bus connects a second slave port on the RAM buffer to a master port on the flash-memory controller and to a master port on the serial engine. The flash-memory controller or the serial engine can use their master ports to transfer data to and from the RAM buffer using the second bus, allowing the CPU to retain control of the CPU bus. The second bus is a flash-serial buffer bus that improves data transfer rates. The flash-memory controller can prefetch into the RAM buffer.

20 Claims, 9 Drawing Sheets

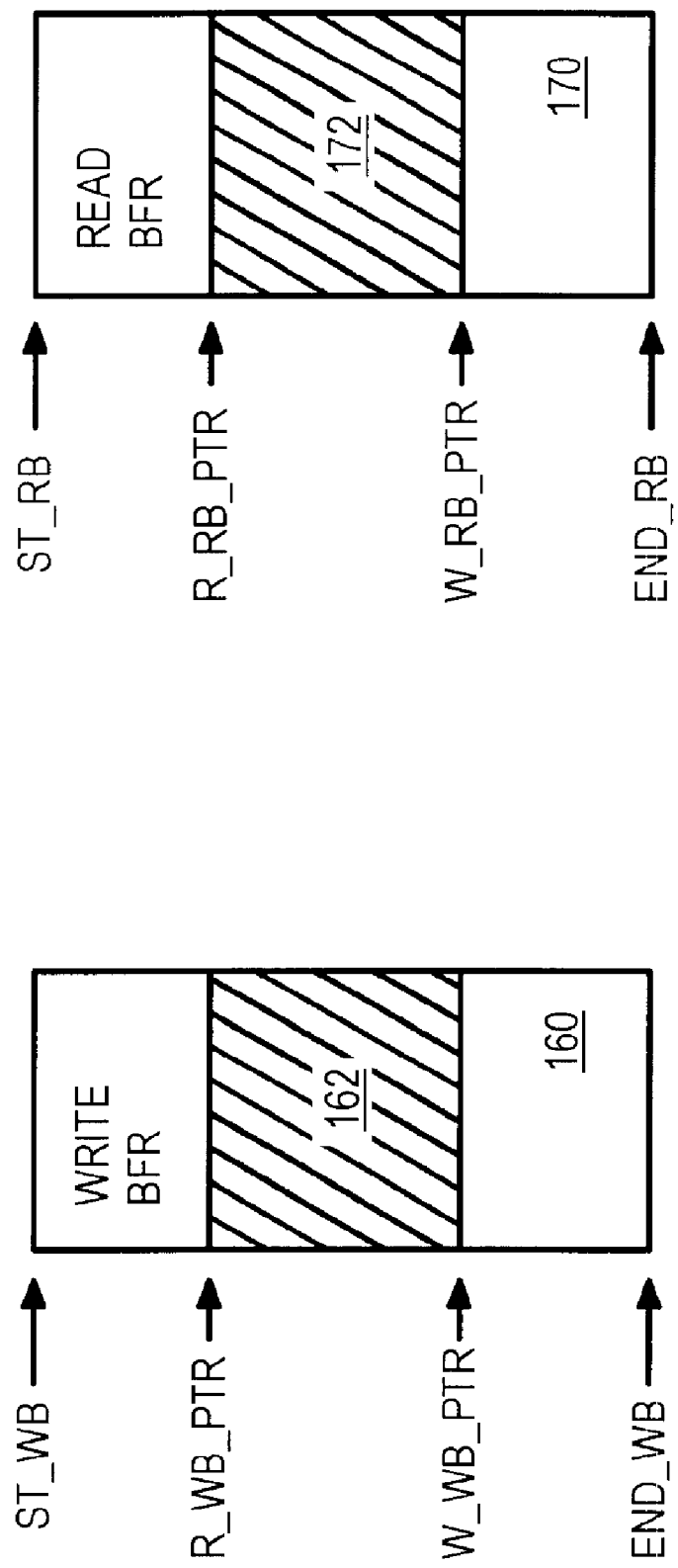

US 6,874,044 B1

FLASH DRIVE/READER WITH SERIAL-PORT CONTROLLER AND FLASH-MEMORY CONTROLLER MASTERING A SECOND RAM-BUFFER BUS PARALLEL TO A CPU BUS

BACKGROUND OF INVENTION

This invention relates to flash-memory drives/readers, and more particularly to parallel bus architectures to improve transfer speed.

Flash memory is widely used as a storage medium for a variety of applications. Flash memory uses electrically-erasable programmable read-only memory (EEPROM) as the non-volatile storage. For example, flash-memory cards can store digital pictures and video from a digital camera and transfer these pictures to a personal computer (PC). The flash-memory card is removed from the digital camera and inserted into a flash-memory reader attached to (or part of) the PC to transfer the pictures. Personal digital assistant (PDA's), music players, and other devices may also use flash-memory cards in a similar way.

A flash-card reader may be a stand-alone device that attaches to the PC using a Universal-Serial-Bus (USB), IEEE 1394, Integrated Device Electronics (IDE), serial AT-attachment (SATA), or other interface. See for example "FlashToaster for Reading Several Types of Flash-Memory Cards With or Without a PC", U.S. Pat. No. 6,483,638, and its children.

USB is a popular interface. Data transfer rates up to 480 Mbps are supported. Unfortunately, flash-memory readers often operate woefully below the ideal transfer rate. For example, current readers may transfer data at a rate of only 7 MB/sec (56 Mbps). The slower transfer rate is undesirable, not just from a speed viewpoint, but because the slower speed can occupy more of the PC's resources for a longer time, reducing the PC's perceived performance. External flash drives that contain permanent flash memory rather than having slots for removable flash-memory cards may also connect to a PC through the USB interface.

FIG. 1 shows a prior-art flash drive. Flash-memory controller 20 reads or writes flash memory 8 that is a permanent or removable part of flash drive controller device 61. CPU 10 executes routines stored in ROM 12 that include routines to send commands to flash-memory controller 20 to read and write the flash memory. CPU 10 also controls serial engine 22, which transfers data serially over USB link 18.

CPU 10 may use scratch-pad RAM 14 to store parameters, execution states, or small amounts of data being reformatted during a transfer, but large amounts of the flash data being transferred is not normally stored in scratch-pad RAM 14. Data is normally transferred word-by-word directly from flash-memory controller 20 to CPU 10 and then to serial engine 22 without storage in scratch-pad RAM 14. New data words over-write any pervious data words, allowing scratch-pad RAM 14 to have a small capacity.

Data transfer rates are limited by bus 16. Bus 16 is a CPU-controlled bus. Master port 15 on CPU 10 acts as a bus master, controlling data transfer to and from one of slave ports 11, 17, 21, 23 on ROM 12, scratch-pad RAM 14, flash-memory controller 20, and serial engine 22, respectively.

FIG. 2 shows a prior-art flash-card reader. Flash-card controllers 24, 26 read or write flash memory on flash cards inserted into slots A, B of flash-card reader controller device 63. CPU 10 executes routines stored in ROM 12 that include routines to send commands to flash-card controllers 24, 26 to read and write the flash memory. CPU 10 also controls serial engine 22, which transfers data serially over USB link 18.

Data is normally transferred byte-by-byte directly from flash-card controllers 24, 26 to CPU 10 and then to serial engine 22 without storage in scratch-pad RAM 14. New data bytes over-write any pervious data bytes, allowing scratch-pad RAM 14 to have a small capacity. The width of bus 16 is often 8-bits (byte), but can be wider, and multiples of bus 16, such as 4, 8, or more burst transfers can occur.

Data transfer rates are limited by bus 16. Bus 16 is a CPU-controlled bus. Master port 15 on CPU 10 acts as a bus master, controlling data transfer to and from one of slave ports 11, 17, 23, 25, 27 on ROM 12, scratch-pad RAM 14, serial engine 22, and flash-card controllers 24, 26, respectively.

FIG. 3 shows a prior art PC with a USB interface. The flash drive/reader of FIGS. 1, 2 can be connected to USB link 128 of the PC in FIG. 3. CPU 104 executes programs for the user or operating system, using code in ROM 106 or in synchronous dynamic-random-access memory (SDRAM) 102. CPU 104 uses master port 105 to access SDRAM 102 through north bridge 108, which is an interface chip.

When transferring data such as a music file over USB link 128 to a flash card in an external reader, CPU 104 writes a data structure (from the music file, for example) in SDRAM 102. Then CPU 104 sends commands to USB host controller 122. CPU 104 uses its master port 105 to send the commands through north bridge 108 over Peripheral Component Interconnect (PCI) bus 120 to USB host controller 122. Master-slave port 123 on USB host controller 122 acts as a slave to receive these commands.

Once the commands are received by USB host controller 122, master-slave port 123 acts as a master of PCI bus 120. USB host controller 122 goes over PCI bus 120 and through north bridge 108 to read the data structure in SDRAM 102 that was earlier written by CPU 104. The data read from SDRAM 102 is then transmitted serially over USB link 128 by USB host controller 122. The serial engine on the external flash device can then accept the serial data and write the flash memory.

While such flash readers are useful and popular, the data transfer rates are limited by the bus architectures employed by the flash reader devices. More advanced bus structures are desirable to increase the data transfer rates. Higher transfer rates within a flash-memory drive or flash-card reader are desirable. Internal transfer rates that better match the USB transfer rates are desired.

BRIEF DESCRIPTION OF DRAWINGS

FIGS. 9A, B show flash-data buffers in the RAM buffer.

DETAILED DESCRIPTION

The present invention relates to an improvement in flash drive/reader bus architectures. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors realize that buffering can improve data throughput. In particular, buffering of the data during; the transfer between the flash-memory controller and the serial engine can improve throughput. The inventors also realize that a second data bus can further accelerate data transfers when the CPU does not use this second data bus.

Figure 1:
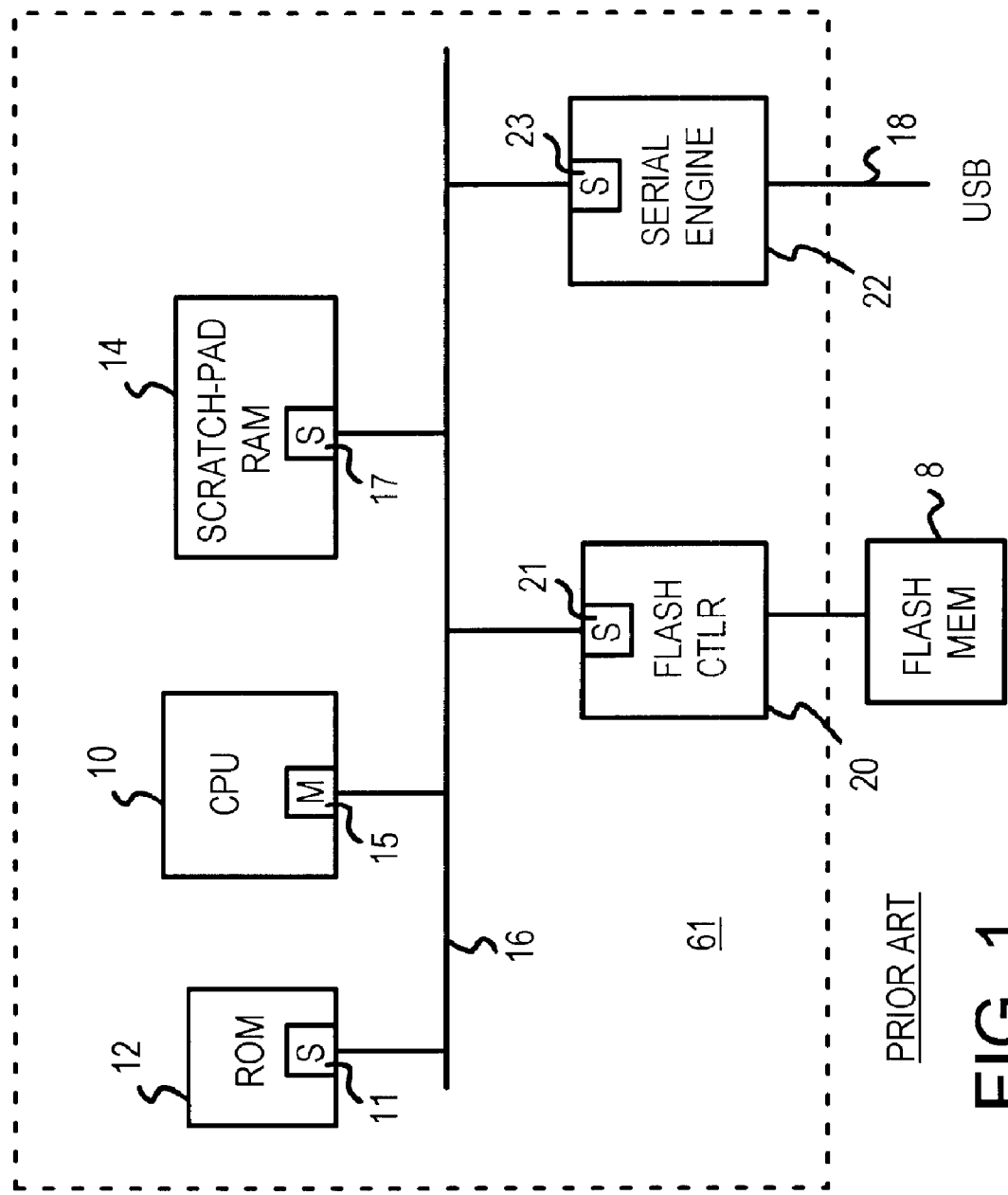
FIG. 1 shows a prior-art flash drive.
Figure 2:
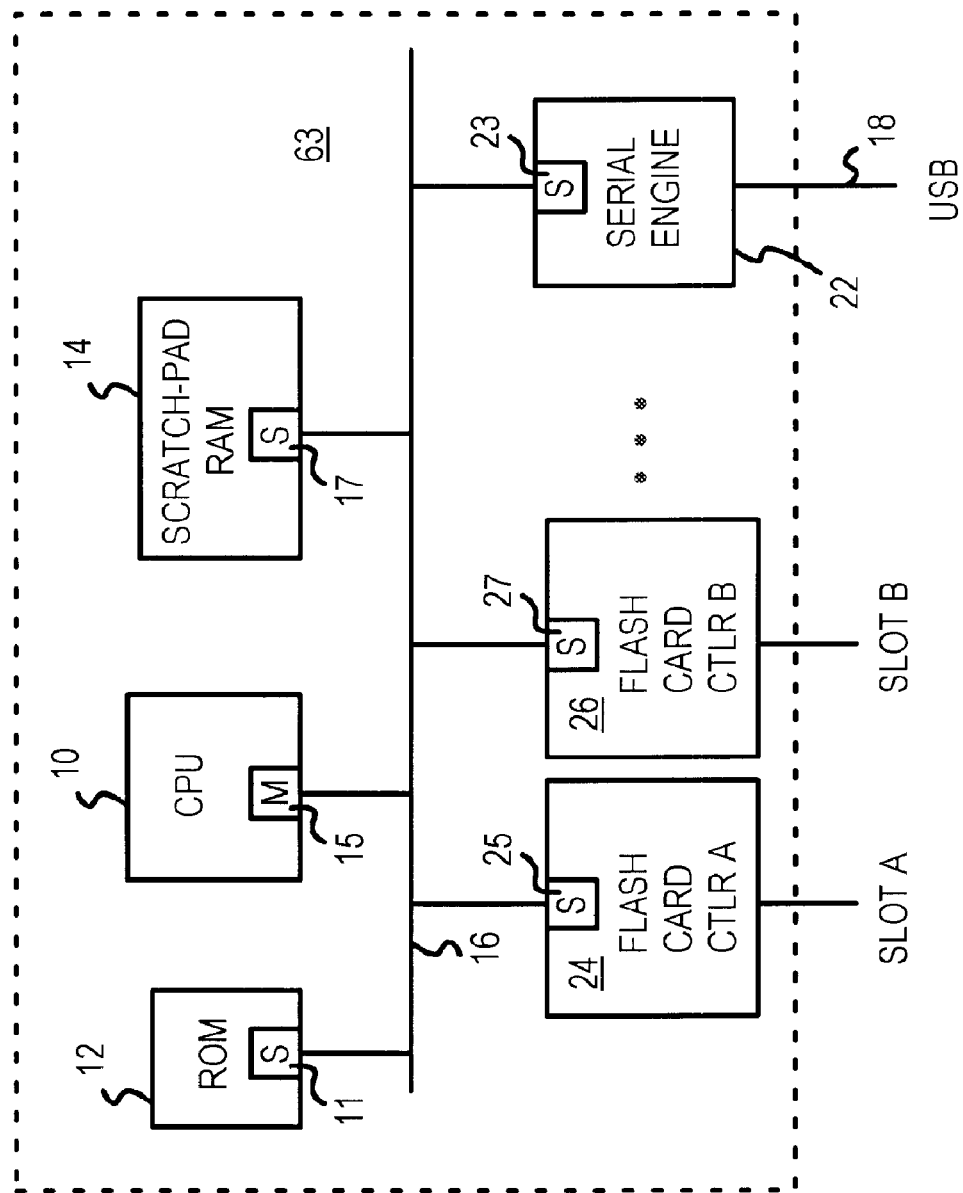
FIG. 2 shows a prior-art flash-card reader.
Figure 3:
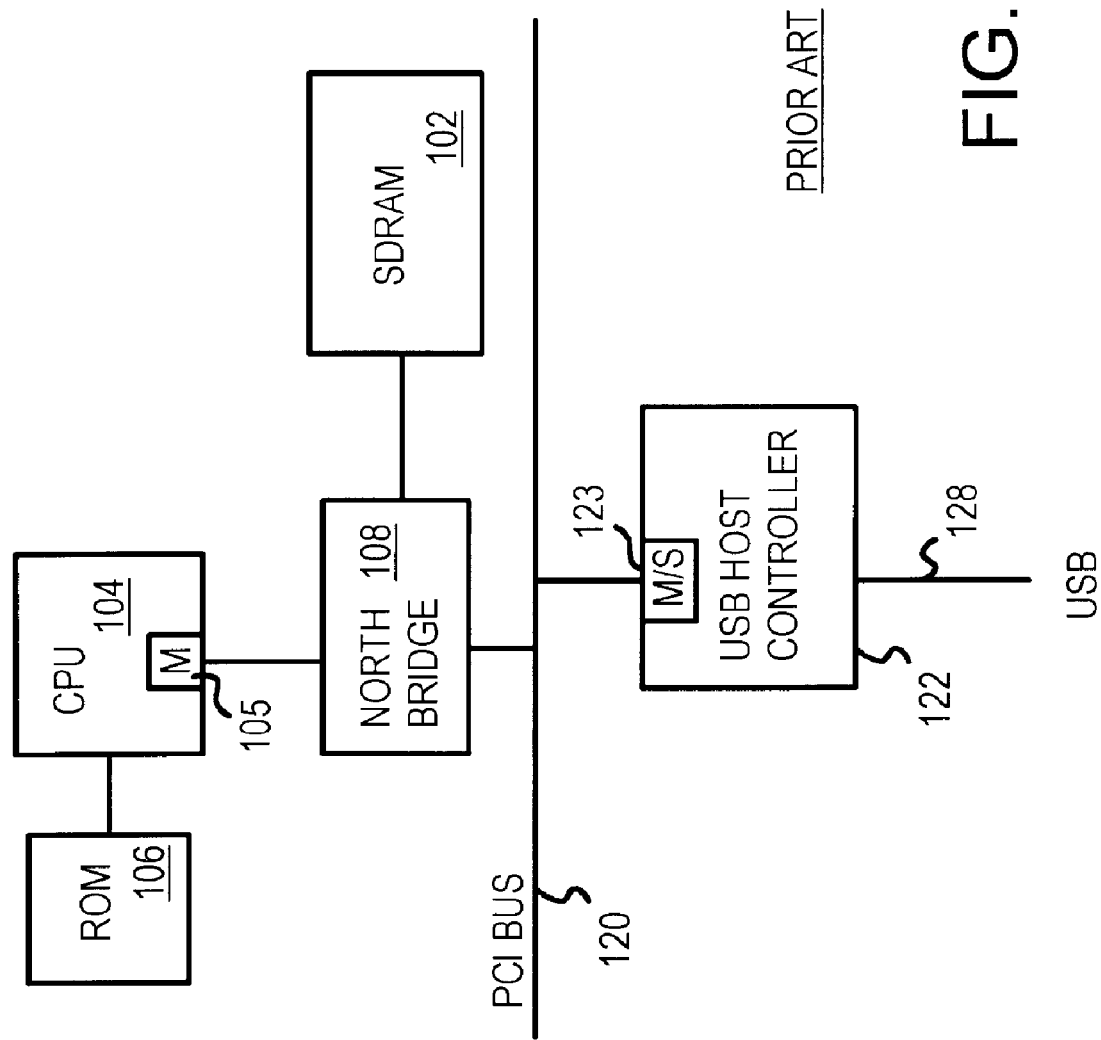
FIG. 3 shows a prior art PC with a USB interface.
Figure 4:
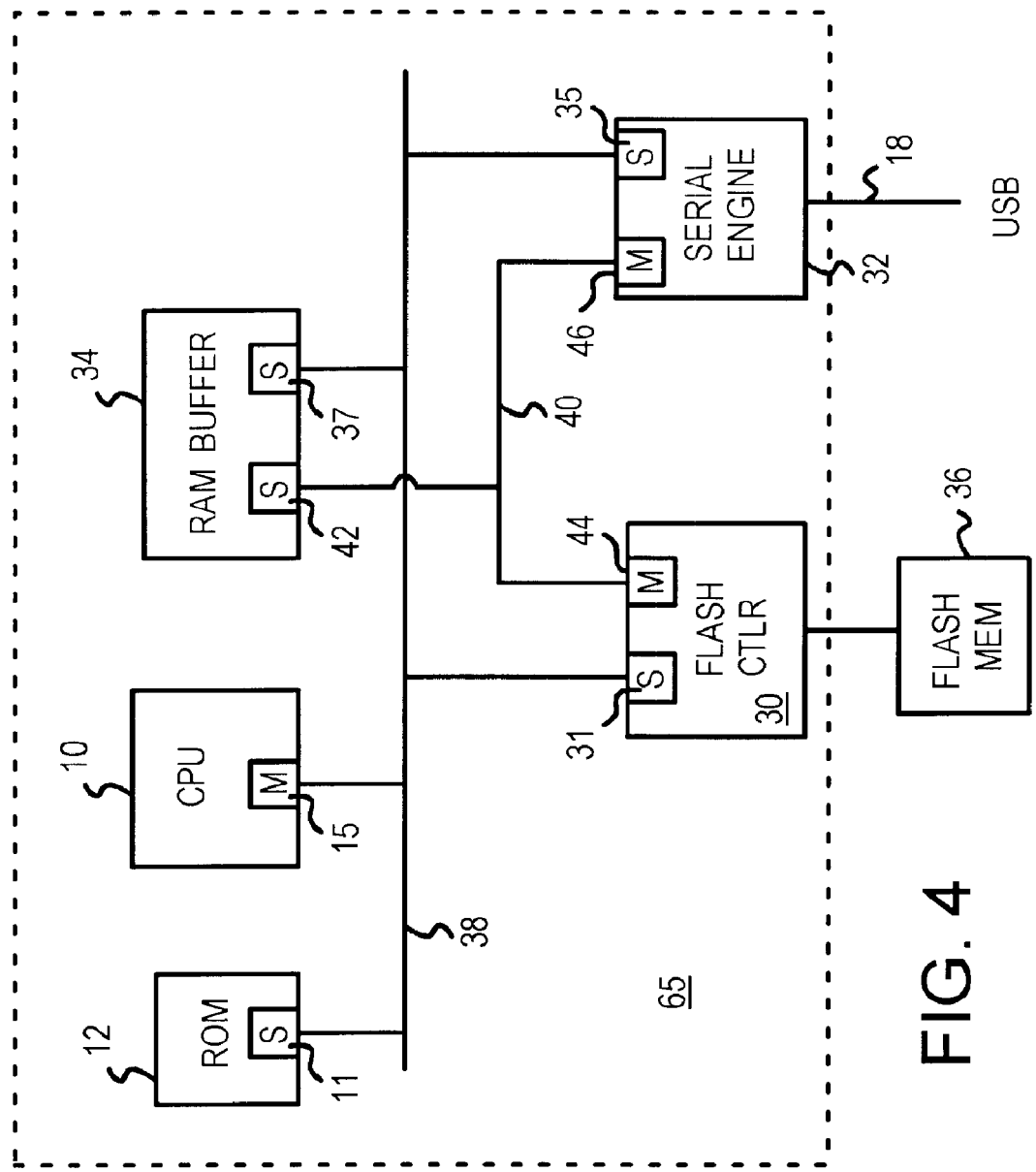
FIG. 4 shows a flash drive with a flash-serial buffer bus in parallel with the CPU bus.

FIG. 4 shows a flash drive with a flash-serial buffer bus in parallel with the CPU bus. CPU bus 38 inside flash drive controller chip 65 allows CPU 10 to access instructions in ROM 12, using master port 15 and slave port 11. Master port 15 can also allow CPU 10 to write commands to flash-memory controller 30 through its slave port 31, or to serial engine 32 through its slave port 35 connected to CPU bus 38.

Once CPU 10 programs flash-memory controller 30 or serial engine 32, data transfers can take place without using CPU bus 38. Instead, flash-serial buffer bus 40 is used. Data from flash memory 36 is transferred by flash-memory controller 30 using its master port 44 to control flash-serial buffer bus 40. Data is sent over bus 40 to slave port 42 of RAM buffer 34.

RAM buffer 34 is large enough to store several larger blocks of flash data. CPU 10 can access RAM buffer 34 over CPU bus 38 using slave port 37. CPU 10 can use a portion of RAM buffer 34 as a scratch-pad memory for processing parameters, but CPU 10 can also read, modify, and/or write back flash data in RAM buffer 34.

Once one or more blocks of flash data have been written into RAM buffer 34 by flash-memory controller 30, serial engine 32 can read the flash data and serially transmit the flash data over USB link 18, uploading the data to a PC or other device. Serial engine 32 uses its master port 46 to read the flash data in RAM buffer 34 using slave port 42.

Serial engine 32 and flash-memory controller 30 each act as bus masters of flash-serial buffer bus 40 when transferring data. CPU 10 can continue to control and use CPU bus 38, acting as the only master of CPU bus 38. Data transfers between flash-memory controller 30 and serial engine 32 do not have to pass through CPU 10 or use CPU bus 38, freeing CPU for other tasks such as system monitoring. Data transfer rates are not slowed by passage through CPU 10, which often has to fetch instructions from ROM 12, adding to processing overhead and delay.

Flash-serial buffer bus 40 is a multi-master bus in this embodiment. Serial engine 32 and flash-memory controller 30 share control of bus 40. CPU 10 continues to control CPU bus 38. Bus 40 is partially in parallel to CPU bus 38, but does not connect to CPU 10 or to ROM 12 as does CPU bus 38. Bus 40 can have address and control signals as well as data signals, as can CPU bus 38. Bus 40 is a flash-serial buffer bus since it connects flash-memory controller 30 to serial engine 32 through RAM buffer 34.

Since RAM buffer 34, flash-memory controller 30, and serial engine 32 each have two ports, one for each of buses 38, 40, concurrent accesses can occur. For example, CPU 10 can send commands or read status registers in serial engine 32 using slave port 35 on CPU bus 38, while flash-memory controller 30 writes flash data to RAM buffer 34 using flash-serial buffer bus 40. Data transfer is not halted or paused by CPU 10 accessing registers in serial engine 32. CPU 10 could even send commands or read status registers in flash-memory controller 30 using slave port 31 on CPU bus 38 while flash-memory controller 30 is transferring flash data to RAM buffer 34 using master port 44 and flash-serial buffer bus 40.

When both CPU 10 and flash-memory controller 30 or serial engine 32 desire to access RAM buffer 34 at the same time, arbitration can be performed by RAM buffer 34 or other control logic. Slave ports 37, 42 can allow access by the two masters to occur one after another with minimal delay, since control of buses 38, 40 does not change. Arbitration is needed for memory access.

Figure 5:
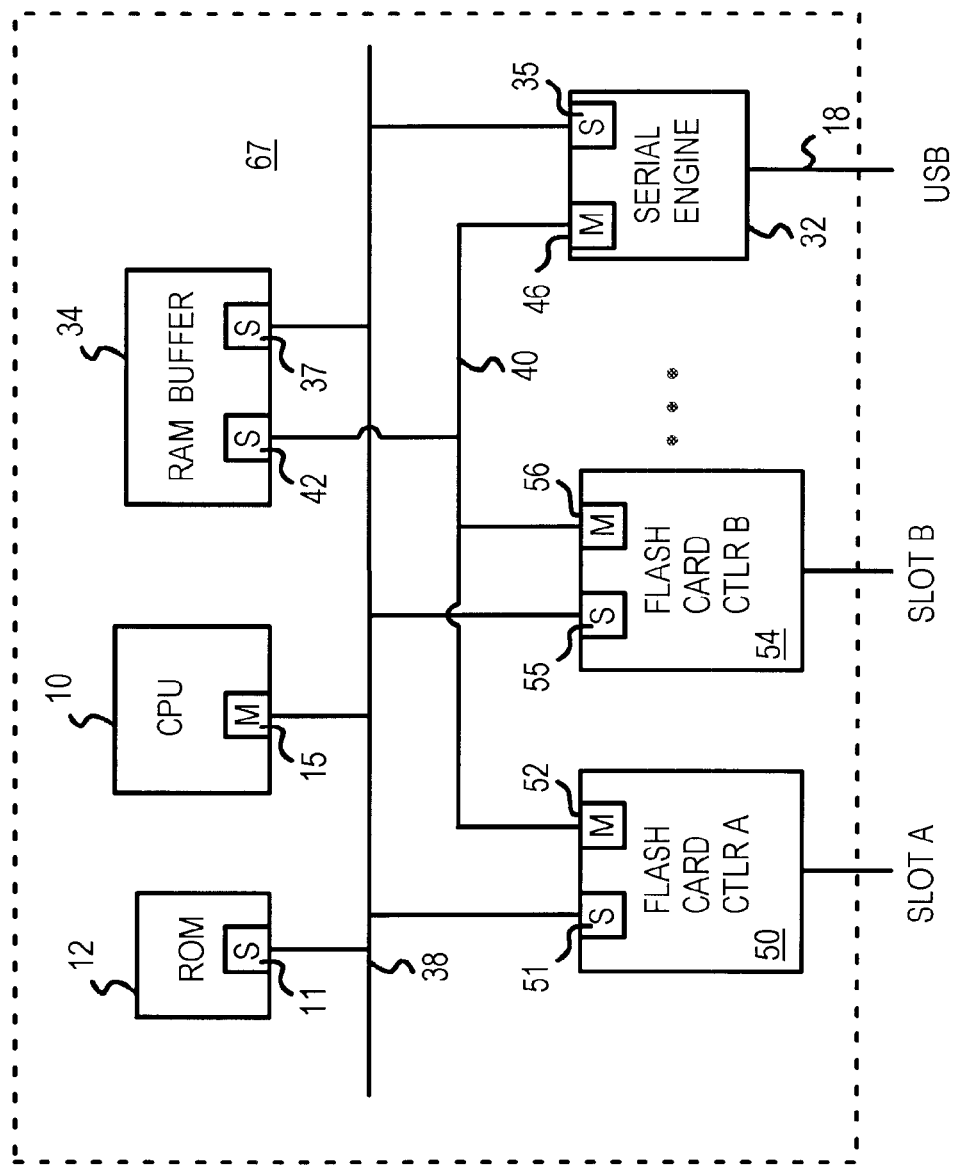
FIG. 5 shows a flash card reader with a flash-serial buffer bus in parallel with the CPU bus.

FIG. 5 shows a flash card reader with a flash-serial buffer bus in parallel with the CPU bus. One or more flash-card controllers 50, 54 connect to both CPU bus 38 and to flash-serial buffer bus 40. When a flash-memory card is inserted into slot A of flash reader 67, flash-card controller 50 can transfer data, while when a flash-memory card is inserted into slot B, flash-card controller 54 can transfer data. CPU 10 sends commands over CPU bus 38 to flash-card controllers 50, 54 using their slave ports 51, 55 and CPU master port 15.

Both flash-card controllers 50, 54 connect to flash-serial buffer bus 40 using master ports. Master port 52 on flash-card controller 50 and read or write data from RAM buffer 34 using its slave port 42, while master port 56 on flash-card controller 54 allows it access of RAM buffer 34 using the same slave port 42. Other flash-card controllers may also be present and connect to flash-serial buffer bus 40 in a similar way.

When data is to be transferred from the host PC or other device to the flash card in slot B, CPU 10 uses CPU bus 38 to command serial engine 32 to transfer the serial data from USB link 18 to RAM buffer 34. Serial engine 32 uses its master port 46 to control bus 40, sending the data to slave port 42 of RAM buffer 34. Once one or more data blocks of the serial data have been written into RAM buffer 34, CPU 10 again uses CPU bus 38 and slave port 55 to command flash-card controller 54 to read the data from RAM buffer 34. Using it master port 56, flash-card controller 54 reads the data from RAM buffer 34 through slave port 42 and flash-serial buffer bus 40. Data could also be transferred in the opposite direction, or using the other flash-card controller 50.

Figure 6:
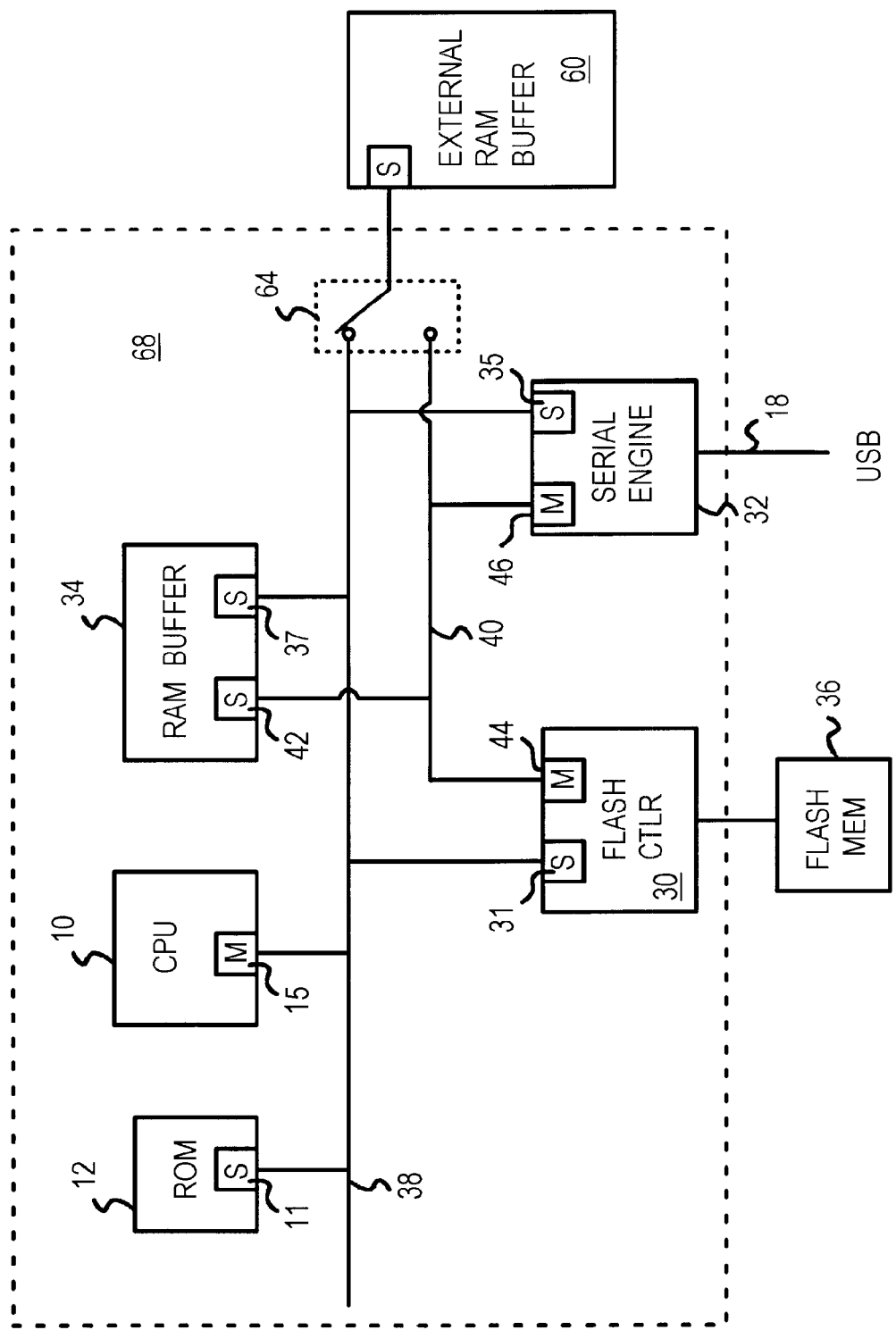
FIG. 6 shows a flash drive with external and internal RAM buffers.

FIG. 6 shows a flash drive with external and internal RAM buffers. Most of the components of the flash drive could be integrated onto a single integrated circuit (IC) chip 68. Flash memory 36 is usually external to chip 68. However, the size of RAM buffer 34 is limited in this embodiment by physical size or cost limitations of chip 68. External RAM buffer 60 is provided off chip 68 when larger buffer sizes are desired. Interface logic 64 allows either CPU bus 38 or flash-serial buffer bus 40 to access external RAM buffer through its slave port. When masters on both CPU bus 38 and flash-serial buffer bus 40 attempt to access external RAM buffer 60 at the same time, arbitration can be performed by interface logic 64 or by other logic.

Flash-memory controller 30 can use its master port 44 and slave port 42 to access RAM buffer 34 for smaller buffers. However, when larger blocks of data are stored, the overflow data is stored in external RAM buffer 60. Flash-memory controller 30 can use its master port 44 to access external RAM buffer 60 through flash-serial buffer bus 40 and interface logic 64. Thus either internal RAM buffer 34 or external RAM buffer 60 can be accessed through flash-serial buffer bus 40.

Figure 7:
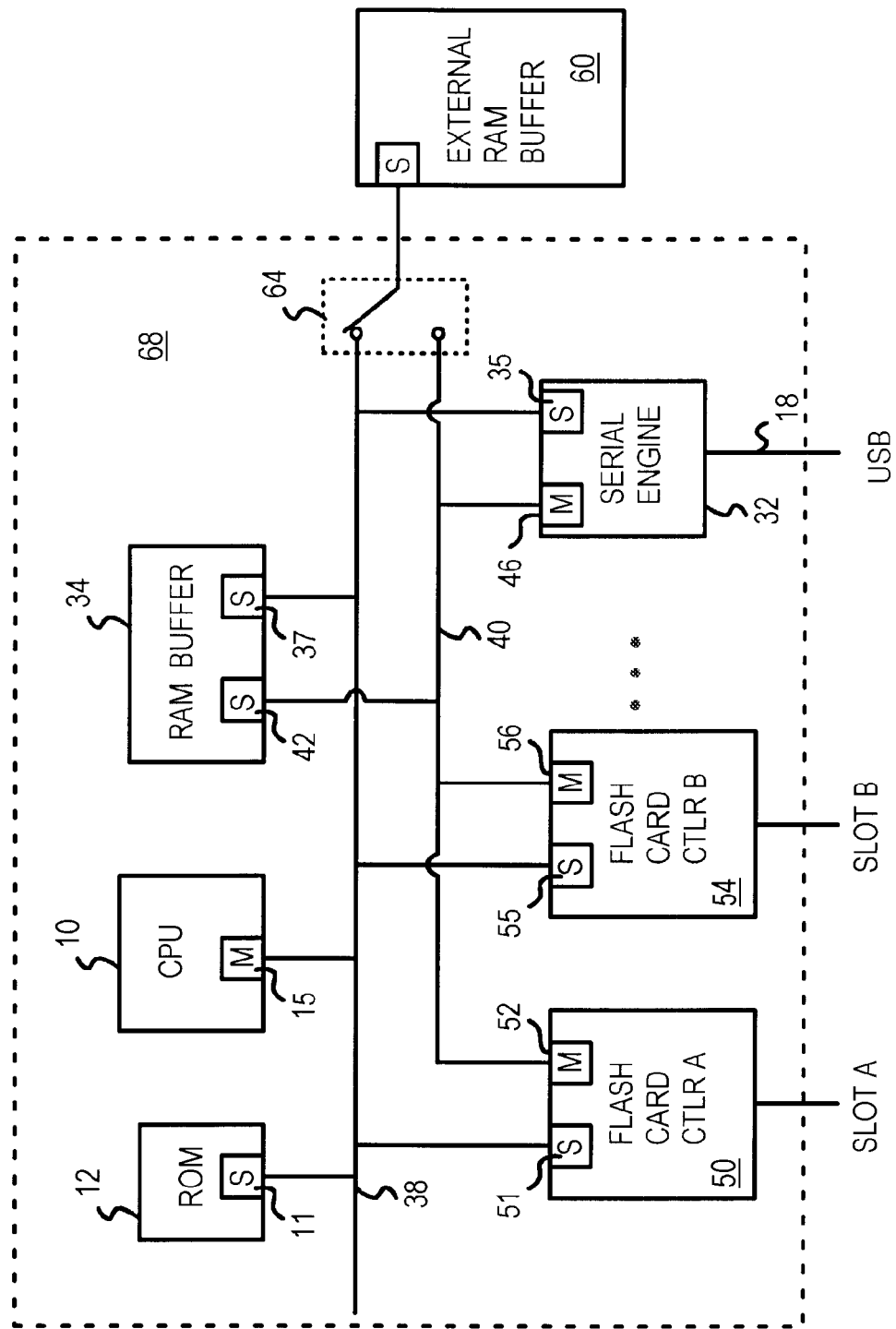
FIG. 7 shows a flash-card reader with external and internal RAM buffers.

FIG. 7 shows a flash reader with external and internal RAM buffers. Flash-card controllers 50, 54 can access external RAM buffer 60 through their master ports 52, 56, over flash-serial buffer bus 40 and interface logic 64.

Likewise, serial engine 32 can use its master port 46 to access either slave port 42 of internal RAM buffer 34, or external RAM buffer 60 through interface logic 64. Other functional blocks may be integrated onto chip 68 besides flash-card controllers 50, 54 and may connect to CPU bus 38 or flash-serial buffer bus 40.

Figure 8:
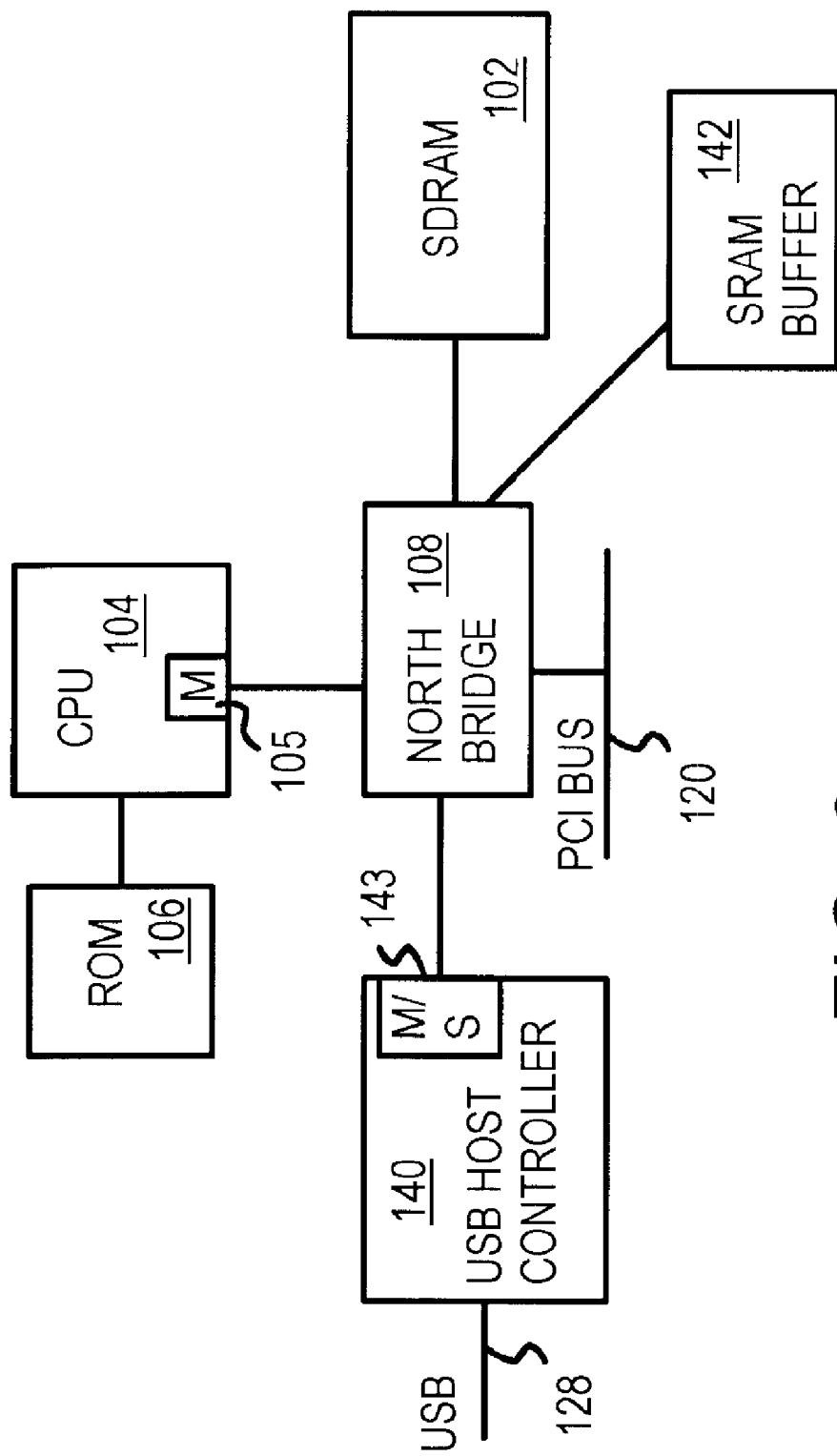
FIG. 8 shows a host PC with improved USB buffering.

FIG. 8 shows a host PC with improved USB buffering. Static random-access memory (SRAM) buffer 142 can be added to store data for transfer over USB host controller 140. CPU 104 executes instructions from ROM 106 or from SDRAM 102 through north bridge 108. When preparing data for writing into a flash memory, CPU 10 can write this data into SRAM buffer 142 through north bridge 108 using its master port 105. A large amount of data can be prepared by CPU 10 and stored in SRAM buffer 142. Then CPU 104 sends a command to USB host controller 140 to begin transfer. USB host controller 140 uses its master-slave port 143 as a master to read the data from SRAM buffer 142 through north bridge 108. Data transfer over USB link 128 can be at a high speed since the dedicated, fast SRAM buffer 142 is accessed rather than slower, shared SDRAM 102. SRAM buffer 142 can be combined with north bridge 108 to be in the same chip or it can be a separate chip and can connect directly to north bridge 108 rather than through slower PCI bus 120.

FIGS. 9A, B show flash-data buffers in the RAM buffer. FIFO buffers can be used for read and write data. FIG. 9A shows write buffer 160 that stores data to be written into a flash memory. Starting and ending locations of write buffer 160 in the RAM buffer can be indicated by start location ST_WB and end location END_WB. The current location for the serial engine to write the next word or block of flash data is pointed to by pointer W_WB_PTR, while the next location for the flash controller to read from is indicated by R_WB_PTR. These pointers are advanced when data is read or written. The pointers can wrap around at the end of write buffer 160. When the write pointer reaches the read pointer the buffer is full and can accept no more data. When the read pointer reaches the write pointer the buffer is empty. Active write-buffer data 162 is the valid data between the two pointers.

FIG. 9B shows read buffer 170 that stores data read from a flash memory. Starting and ending locations of read buffer 170 in the RAM buffer can be indicated by start location ST_RB and end location END_RB. The current location for the flash controller to write the next word or block of flash data is pointed to by pointer W_RB_PTR, while the next location for the serial engine to read from is indicated by R_RB_PTR. These pointers are advanced whenever data is written or read. The pointers can wrap around at the end of read buffer 170. When the write pointer reaches the read pointer the buffer is full and can accept no more data. When the read pointer reaches the write pointer the buffer is empty. Active read-buffer data 172 is the valid data between the two pointers.

Hardware comparators or other logic can be used to detect full and empty conditions. The CPU can write the starting and ending locations, allowing the CPU to adjust memory allocations for read and write buffers. Blocks or pages of flash memory can be stored in a variety of arrangements.

Prefetching of flash data may be performed by flash-memory controller 30 (FIGS. 4, 6) or by flash-card controllers 50, 54 (FIGS. 5, 7) writing additional pages of flash data to the RAM buffer. For example, m blocks of flash data may be pre-fetched, where m can be a programmable number of pages to pre-fetch ahead of the current page being read.

When a read request comes in over USB link 18 to serial engine 32, serial engine 32 first checks a catalog of prefetched flash blocks or pages already stored in RAM buffer 34. When the required data is already present in RAM buffer 34, then serial engine 32 can read this data directly from RAM buffer 34 and can transmit the data over USB link 18 at a higher rate, up to the maximum rate of 480 bps.

The read-buffer FIFO's read pointer R_RB_PTR is changed to the location of the desired data in the read buffer in the RAM buffer. The desired data can then be read from the RAM buffer without the delay of reading the flash memory.

The flash controller can then pre-fetch another m pages from the new current location. The write pointer is set to the end of the page being read, or to the end of the block of pre-fetched data that includes the page being read by the serial engine. Then the flash controller reads up to an additional m pages of flash data past the current page and writes them to the RAM buffer, advancing the read-buffer FIFO's write pointer W_RB_PTR.

Thus pre-fetching is performed into the FIFO read buffer. When the serial engine causes the read pointer to move past old pre-fetched data, the old data is discarded. Various pre-fetching lengths m and algorithms can be used to try to improve performance.

When the required data is not present in RAM buffer 34, then serial engine 32 can send an interrupt to CPU 10. CPU 10 then sends a command to flash-memory controller 30 or to one of flash-card controllers 50, 54 to read the required data from flash memory and store it in RAM buffer 34. CPU 10 can modify the flash data in RAM buffer 34 if needed. Once the flash data has been written to RAM buffer 34, then serial engine 32 can resume transferring the data over USB link 18. When the required data is not present in RAM buffer 34, then the transfer rate over USB link 18 is less than the maximum.

Alternate Embodiments

Several other embodiments are contemplated by the inventors. While the term "reader" has been used with reference to various flash devices, both reading and writing of the flash memory can usually be performed by the "readers" or flash drives. Data may be buffered again by the flash-memory controller, pipelines in the CPU, or at other locations besides the RAM buffer. The flash memory chips themselves may internally buffer data being written in or read out.

Various alternative mastering schemes could be used. Direct transfers bypassing RAM buffer 34 could be performed between the serial engine and the flash-memory controller or flash-card controllers when only the serial engine is the bus master and a large buffer exists in serial engine or in one of the flash controllers. RAM buffer 34 could have one internal port and two external slave ports, or could have external logic to combine the two slave ports to access one port on RAM chips. A full dual-port RAM could also be used.

Buses can have address and control signals as well as data signals. Data and address could be time-multiplexed to use the same physical metal traces, or could have dedicated wiring lines. Master and slave ports can be interfaces that include data, address, and control signals. Often the master generates the address and many control signals, but the slave generates reply control signals such as READY. The slave supplies data on reads but accepts data on writes. Timing is mainly controlled by the master, but the slave can sometimes adjust timing, such as by delaying a READY or other handshake signal, or by terminating an access early.

Rather than just two buses, three or more buses may be used in parallel. For example, two flash-serial buffer buses could be used, allowing both the serial engine and the flash-memory controller or flash-card controller to transfer data concurrently. Buses that connect to only a subset of the controllers or to the serial engine could be used when many buses are used. One bus could be dedicated to transfers between the serial engine and the RAM buffer 34, while another bus is for transfers between the RAM buffer and the flash-memory controller. Additional RAM buffers could be added, or the RAM buffer could be partitioned to allow simultaneous access without arbitration delays of different memory partitions. Rather than use FIFO buffers, the flash data can be stored out of sequence. A catalog or index can be used to locate the desired pages, or other address re-mapping or translation logic may be used.

The CPU can perform high-level protocols and more complex operations for serial engine 32, flash-memory controller, or flash-card controllers 50, 54. This can allows for a reduced complexity for the controllers since complex functions can be programmably executed by CPU 10. The serial engine can use a USB link, or can use other links, such as IEEE 1394, ATA, SATA, IDE, PCI Express, mini-PCI Express, infrared, Bluetooth, RF, etc.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. § 1.72(b). Any advantages and benefits described may not apply to all embodiments of the invention. When the word "means" is recited in a claim element, Applicant intends for the claim element to fall under 35 USC § 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word means are not intended to fall under 35 USC §112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A flash-memory peripheral comprising:
   a local central processing unit (CPU) for executing instructions for operating the flash-memory peripheral;
   a CPU bus primarily controlled by the local CPU;
   a flash-serial buffer bus not primarily controlled by the local CPU;
   a RAM buffer for storing flash data for storage by the flash-memory peripheral;
   a flash-memory controller for controlling a flash memory that stores the flash data, having a slave port for coupling to the CPU bus and receiving commands from the local CPU, and having a master port for coupling to the flash-serial buffer bus for transferring flash data to the RAM buffer;
   a serial link for connecting the flash-memory peripheral to a personal computer; and
   a serial engine for sending and receiving the flash data serially over the serial link, the serial engine having a slave port for coupling to the CPU bus and receiving commands from the local CPU, and having a master port for coupling to the flash-serial buffer bus for transferring flash data to the RAM buffer;
   wherein the flash data is read from the flash memory by the flash-memory controller and sent over the flash-serial buffer bus to the RAM buffer;
   wherein the flash data is read from the RAM buffer through the flash-serial buffer bus to the serial engine to be sent serially over the serial link,
   wherein incoming flash data is written to the RAM buffer through the flash-serial buffer bus from the serial engine,
   wherein the incoming flash data is read from the RAM buffer through the flash-serial buffer bus to the flash-memory controller and written to the flash memory,
   whereby the flash-serial buffer bus transfers the flash data and the CPU bus sends commands to the flash-memory controller and to the serial engine.

2. The flash-memory peripheral of claim 1 further comprising:
   a first slave port on the RAM buffer, for connecting the CPU bus to the RAM buffer;
   a second slave port on the RAM buffer, for connecting the flash-serial buffer bus to the RAM buffer,
   whereby the RAM buffer has two slave ports to connect to two buses.

3. The flash-memory peripheral of claim 2 further comprising:
   a read-only-memory ROM, coupled to the local CPU, for storing instructions to be executed by the local CPU including instructions to send commands to the flash-memory controller or to the serial engine.

4. The flash-memory peripheral of claim 3 wherein the ROM is coupled to the local CPU through the CPU bus or through a ROM bus separate from the CPU bus.

5. The flash-memory peripheral of claim 2 further comprising:
   a flash memory for storing the flash data, the flash memory permanently connected to the flash-memory controller,
   wherein the flash-memory peripheral is a flash drive.

6. The flash-memory peripheral of claim 2 further comprising:
   a slot for accepting a flash-memory card removably inserted by a user;
   wherein the flash-memory controller is a flash-card controller connected to the slot;
   wherein the flash-memory peripheral is a flash-card reader.

7. The flash-memory peripheral of claim 2 further comprising:
   a plurality of slots each for accepting a flash-memory card for storing the flash data;
   a plurality of flash-card controllers, coupled to the plurality of slots to read flash-memory cards inserted into the plurality of slots, each flash-card controller having a slave port coupled to the CPU bus to receive commands from the local CPU, and each having a master port coupled to the flash-serial buffer bus, for transferring flash data to the RAM buffer,
   wherein the flash-memory peripheral is a multi-slot flash-card reader.

8. The flash-memory peripheral of claim 2 wherein the serial link is a Universal-Serial-Bus (USB).

9. The flash-memory peripheral of claim 2 wherein the serial link is a IEEE 1394 bus, an Integrated-Device-Electronics (IDE) bus, a serial AT-attachment (SATA) bus, a PCI Express bus, or a mini-PCI Express bus.

10. A flash reader comprising:
a local processor that executed instructions for controlling operation of the flash reader;
a processor bus, mastered by the local processor, for sending commands from the local processor;
a buffer bus, not connected to the local processor, for transferring flash data;
a RAM buffer for storing flash data;
a flash-memory controller for reading flash data from a flash memory in response to commands from the local processor;
a serial engine for sending the flash data as serial data over a serial interface;
a flash slave port, on the flash-memory controller, for connecting the flash-memory controller to the processor bus as a bus-slave device;
a flash master port, on the flash-memory controller, for connecting the flash-memory controller to the buffer bus when the flash-memory controller acts as a bus-master device;
an engine slave port, on the serial engine, for connecting the serial engine to the processor bus as a bus-slave device;
an engine master port, on the serial engine, for connecting the serial engine to the buffer bus when the serial engine acts as the bus-master device;
a first slave port, on the RAM buffer, for connecting the RAM buffer to the processor bus as a bus-slave device; and
a second slave port, on the RAM buffer, for connecting the RAM buffer to the buffer bus as a bus-slave device when the flash-memory controller or the serial engine acts as the bus-master device,
whereby the processor bus transfers commands while the buffer bus transfers the flash data bypassing the local processor.

11. The flash reader of claim 10 wherein the processor bus acts independently of the buffer bus, the local processor able to send commands over the processor bus independent of and at a same time as flash data is transferred over the buffer bus.

12. The flash reader of claim 11 wherein the local processor reads flash data from the RAM buffer, modifies the flash data, and writes modified flash data back to the RAM buffer, using the processor bus and the first slave port of the RAM buffer,
whereby the local processor can modify the flash data stored in the RAM buffer using the processor bus.

13. The flash reader of claim 11 wherein the flash-memory controller is a first flash-card controller connected to a first slot for receiving a first flash-memory card that stores flash data;
further comprising:
a second flash-card controller connected to a second slot for receiving a second flash-memory card that stores flash data;
a second flash slave port, on the second flash-card controller, for connecting the second flash-card controller to the processor bus as a bus-slave device;
a second flash master port, on the second flash-card controller, for connecting the second flash-card controller to the buffer bus when the second flash-card controller acts as a bus master device,
whereby multiple flash-cards can be read by flash reader.

14. The flash reader of claim 11 wherein the RAM buffer stores pre-fetched blocks of the flash data read by the flash-memory controller into the RAM buffer before the serial engine requests the pre-fetched blocks, whereby pre-fetched flash data is stored by the RAM buffer.

15. The flash reader of claim 11 wherein the RAM buffer comprises:
a write buffer storing flash data from the serial engine for writing to the flash memory by the flash-memory controller;
a read buffer storing flash data from the flash memory written to the RAM buffer by the flash-memory controller.

16. The flash reader of claim 15 wherein the write buffer and the read buffer are FIFO buffer regions in the RAM buffer.

17. The flash reader of claim 11 further comprising:
interface logic, coupled to the processor bus and coupled to the buffer bus, for connecting the processor bus or the buffer bus to an external RAM buffer for storing an overflow of flash data,
whereby overflow flash data is stored in the external RAM buffer.

18. A flash device comprising:
processor means for executing controlling instructions;
first bus means for transferring commands from the processor means;
buffer bus means for transferring flash data that by-passes the processor means;
data buffer means, coupled to the buffer bus means as a bus slave, for storing flash data being read by the flash device;
flash-memory controller means, coupled to the first bus means as a bus slave, and coupled to the buffer bus means as a bus master, for controlling a flash memory and for reading flash data from the flash memory; and
serial engine means, coupled to the first bus means as a bus slave, and coupled to the buffer bus means as a bus master, for reading flash data stored by the data buffer means and for serially transmitting the flash data over a serial link;
wherein the flash data is transferred from the flash-memory controller means to the data buffer means over the buffer bus means bypassing the processor means;
wherein the flash data is transferred from the data buffer means to the serial engine means over the buffer bus means bypassing the processor means,
whereby transfers of the flash data use the buffer bus means to bypass the processor means.

19. The flash device of claim 18 wherein the buffer bus means is unconnected to the processor means, but the data buffer means is connected to the first bus means as a bus slave;
wherein the serial link is a Universal-Serial-Bus (USB), a IEEE 1394 bus, a PCI Express bus, or a mini-PCI Express bus.

20. The flash device of claim 19 wherein the serial link connects to a personal computer that has a static random-access memory (SRAM) buffer for storing blocks of data generated by a CPU on the personal computer for transfer over the serial link and storage as flash data by the flash device.

* * * * *